United States Patent
Xu (10) Patent No.: US 7,352,306 B2
(45) Date of Patent: Apr. 1, 2008

(54) ANALOG-TO-DIGITAL CONVERTER WITH NON-LINEARITY COMPENSATION

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/291,660

(22) Filed: Nov. 30, 2005

(65) Prior Publication Data
US 2007/0120720 A1    May 31, 2007

(51) Int. Cl.
*H03M 1/06* (2006.01)
(52) U.S. Cl. ............................. 341/118; 341/155
(58) Field of Classification Search ................ 341/155, 341/144, 161, 118, 120
See application file for complete search history.

(56) References Cited

U.S. PATENT DOCUMENTS

| | | | | |
|---|---|---|---|---|
| 5,047,772 | A * | 9/1991 | Ribner | 341/156 |
| 5,594,612 | A | 1/1997 | Henrion | 341/120 |
| 6,211,806 | B1 * | 4/2001 | McCarroll | 341/161 |
| 6,784,814 | B1 * | 8/2004 | Nair et al. | 341/118 |
| 6,861,969 | B1 * | 3/2005 | Ali | 341/161 |
| 2003/0184466 | A1 | 10/2003 | Takeyabu et al. | 341/156 |
| 2004/0125006 | A1 | 7/2004 | Tani et al. | 341/155 |

OTHER PUBLICATIONS

International Search Report for Application No. PCT/US2006/045450, dated Jun. 7, 2007.
Written Opinion for Application No. PCT/US2006/045450, dated Jun. 7, 2007.

* cited by examiner

*Primary Examiner*—Peguy JeanPierre
(74) *Attorney, Agent, or Firm*—Fish & Richardson P.C.

(57) ABSTRACT

Systems and techniques for converting an analog input value to an output digital code are described. A system includes a first internal analog-to-digital converter (ADC) configured to receive the analog input value and to convert it to a first digital code; a first internal digital-to-analog converter (DAC) configured to convert the first digital code to a first analog value; a first linearization module configured to receive the first digital code and to produce a first linear-correction code that is approximately equal to the first analog value; a second internal ADC configured to convert a remainder portion of the analog input value to a second digital code; and an accumulator configured to combine the first linear-correction code and the second digital code to produce the output digital code.

19 Claims, 9 Drawing Sheets

ANALOG-TO-DIGITAL CONVERTER WITH NON-LINEARITY COMPENSATION

TECHNICAL FIELD

This patent application relates to improving the performance of an analog-to-digital converter (ADC), and more particularly to improving the accuracy of a pipelined ADC.

BACKGROUND

An analog-to-digital converter (ADC) converts an analog input signal to a digital output code. The output of an ADC may deviate from the ideal output due to variations in manufacturing and due to various sources of inaccuracy in the analog-to-digital conversion process. The transfer function of an ADC is a plot of the code generated at the ADC output as function of the input signal value. Such a plot is not continuous but is a plot of $2^N$ steps, where N the number of bits in the digital output. For an ideal ADC, a single straight line can be drawn through the points at each code-transition boundary, beginning at the origin of the plot.

Figure 1:
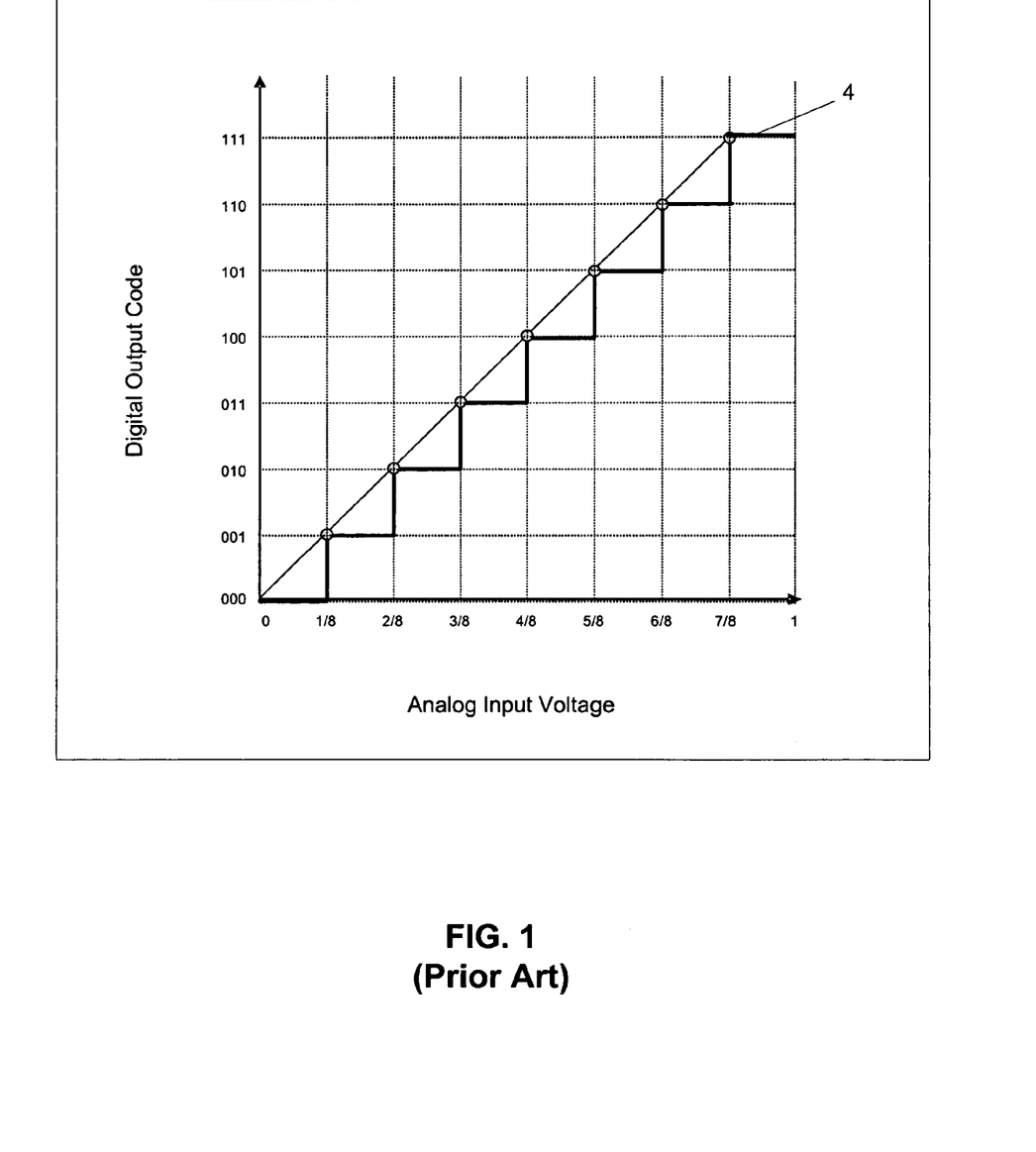
FIG. 1 shows a plot of an ideal transfer function of an analog-to-digital (ADC) converter.

FIG. 1 shows a plot 2 of an ideal transfer function 4 for a 3-bit ADC with reference points at code transition boundaries. The ADC in this example produces a total of eight steps that each represents a value of the analog input signal. The transition occurs at one code width, which is equal to a least significant bit (LSB). The actual value of an LSB is equal to $V_{ref}2^N$, where $V_{ref}$ is the reference voltage that determines the full-scale range of the ADC. The resolution of the ADC, which determines the best accuracy to which the ADC can represent an analog input value, is equal to the value of the LSB.

Limitations in the materials used in fabrication and inaccuracies inherent in the conversion process itself cause the actual transfer function of an ADC to deviate from the ideal transfer function. Furthermore, the deviation of each code may depend on previous state of all related circuits and especially on whether the ADC is transitioning from a lower code to a higher code or vice versa.

Figure 2:
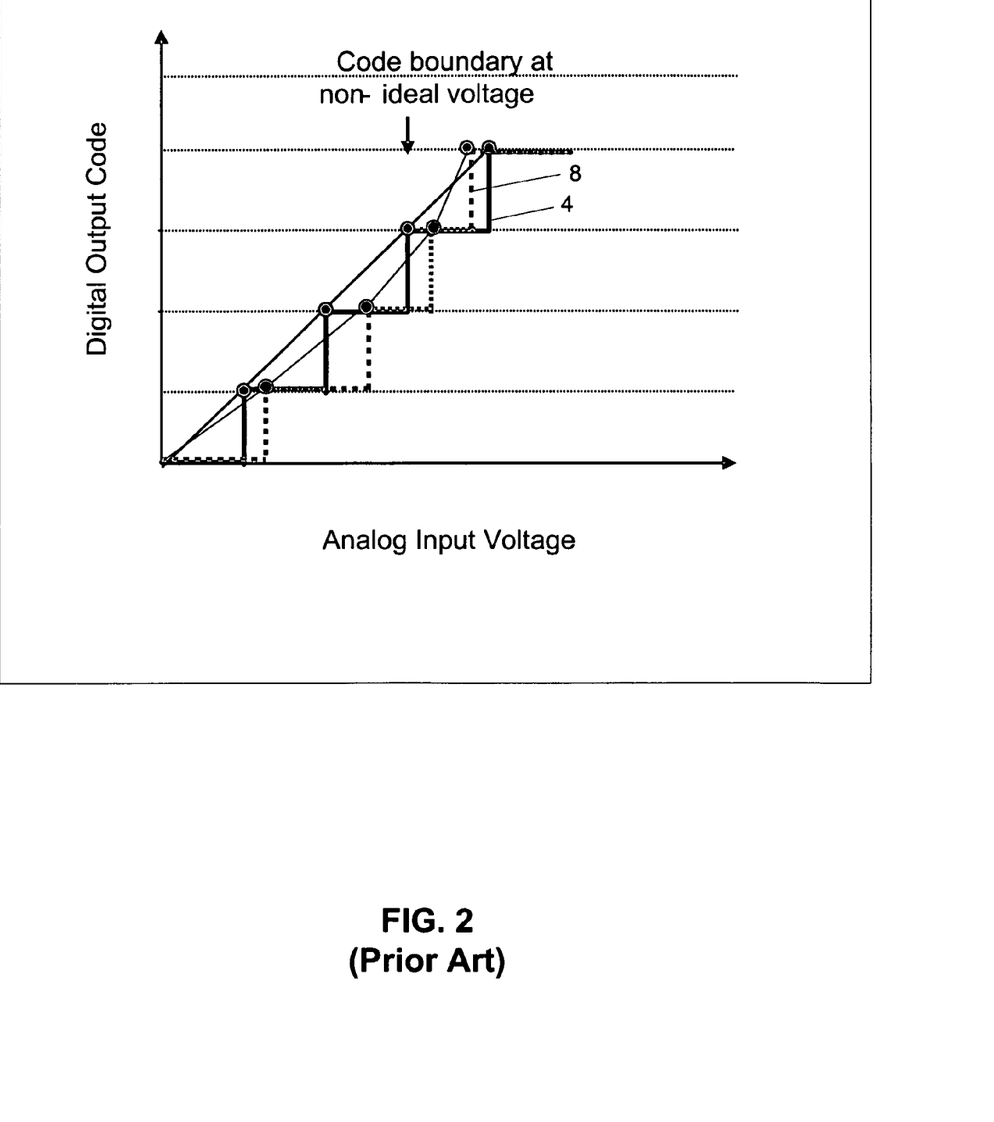
FIG. 2 shows a plot of an actual transfer function of an ADC.

The deviation of an ADC's transfer function from a straight line is referred to as non-linearity, and more particularly as integral non-linearity (INL). FIG. 2 illustrates a plot 6 of non-linear deviation between the ideal transfer function 4 and the actual transfer function 8 of the exemplary 3-bit ADC. The differences between the ideal voltage levels at which code transitions occur and the actual voltage are referred to as non-linear errors. Non-linear errors can adversely affect the accuracy of an ADC and cause the ADC to produce incorrect codes. In a pipelined ADC that includes multiple internal ADCs, the non-linear errors of the internal ADCs causes an accumulation of errors in the output code as the signal passes through each internal ADC.

SUMMARY

The invention provides systems and methods, including computer program products, for converting an analog input value to an output digital code.

In general, in one aspect, the invention features a system that includes: a first internal analog-to-digital converter (ADC) configured to receive the analog input value and to convert it to a first digital code; a first internal digital-to-analog converter (DAC) configured to convert the first digital code to a first analog value; a first linearization module configured to receive the first digital code and to produce a first linear-correction code that is approximately equal to the first analog value; a second internal ADC configured to receive a remainder portion of the analog input value, which includes the difference between the analog input value and the first analog value, and to convert the remainder portion to a second digital code; and an accumulator configured to combine the first linear-correction code and the second digital code to produce the output digital code.

In general, in another aspect, the invention features a method for converting an analog input value to an output digital code. At a first internal analog-to-digital converter (ADC), the analog input value is received and then converted to a first digital code. At a first internal digital-to-analog converter (DAC), the first digital code is converted to a first analog value. At a first linearization module, the first digital code is received, and a first linear-correction code that is approximately equal to the first analog value is produced. At a second internal ADC, a remainder portion of the analog input value, which includes the difference between the analog input value and the first analog value, is received and converted to a second digital code. The first linear-correction code and the second digital code are combined to produce the output digital code.

Embodiments may include one or more of the following. A second linearization module that is configured to receive the second digital code may be provided. The second linearization module may be configured to produce a second linear-correction code that is approximately equal to a previously measured analog input voltage value of the second internal ADC corresponding to the second digital code. The accumulator may be configured to sum the first linear-correction code and the second linear-correction code to produce the output digital code.

The first linearization module may include a first lookup table coupled to an output of the first internal ADC; and the second linearization module may include a second lookup table coupled to an output of the second internal ADC. Each of the first and second lookup tables may be a two-dimensional, indexed by a previous code and by a current code, and configured to produce a linear-correction code corresponding to the previous code and the current code.

The first linearization module may include a two-dimensional lookup table, coupled to an output of the first internal ADC that stores a first linear-correction code that corresponds to the first digital code when the first internal ADC transitions to the first digital code from a higher code. The first linearization module may also store a second linear-correction code that corresponds to the first digital code when the first internal ADC transitions to the first digital code from a lower code. The first linearization module may also be configured to compare the first digital code to a previous digital code produced by the first internal ADC; determine that the analog input value is increasing; and select the first linear-correction code.

The second linearization module may include a two-dimensional lookup table, coupled to an output of the second internal ADC, that stores a first linear-correction code that corresponds to the second digital code when the second internal ADC transitions to the second digital code from a higher code. The second linearization module may include a second linear-correction code that corresponds to the second digital code when the second internal ADC transitions to the second digital code from a lower code. The second linearization module may also be configured to compare the second digital code to a previous digital code produced by the second internal ADC; determine that the remainder portion is decreasing; and select the second linear-correction code. The second internal ADC may have a full-scale range that is greater than the remainder portion, which may include a sum of a quantization error contributed from the first internal ADC and non-linearity errors contributed from the first internal ADC, from the first internal DAC, and from a subtractor that computes the remainder portion. For example, the full-scale range of the second internal ADC may be greater than one least-significant bit of the first internal DAC. The first and second linear-correction codes may include the most significant range and least significant range, respectively, of the output digital code.

Some embodiments may provide one or more of the following advantages. Non-linearity can be reduced at each stage of a pipelined converter to improve the overall accuracy at the output. A linearization LUT may be provided at each stage of the pipelined converter to compensate for non-linear errors produced at the outputs of the internal DACs. For every code of an internal DAC, a lookup table (LUT) may store the actual output voltage that was measured for that code. In more general case, the LUT may be two-dimensional and produce a linear correction value (i.e., a digital code) that is indexed by the current code as well as the previous code received by the DAC. To reduce the size of the LUT by accepting a lower performance, the LUT may store, for each pair of codes, linear correction values to be expressed when the LUT determines that the input voltage is increasing and linear correction values to be expressed when the LUT determines that the input voltage is decreasing. In this way, the LUT may account for the memory affect of the internal converter. Linearization LUTs may be provided to correct for linearization errors in each of the internal DAC of the pipelined ADC.

The details of one or more embodiments of the invention are set forth in the accompanying drawings and the description below. Other features, objects, and advantages of the invention will be apparent from the description and drawings, and from the claims.

DETAILED DESCRIPTION

According to the Applicant's best understanding, FIGS. 1-5 are prior art.

Figure 3:
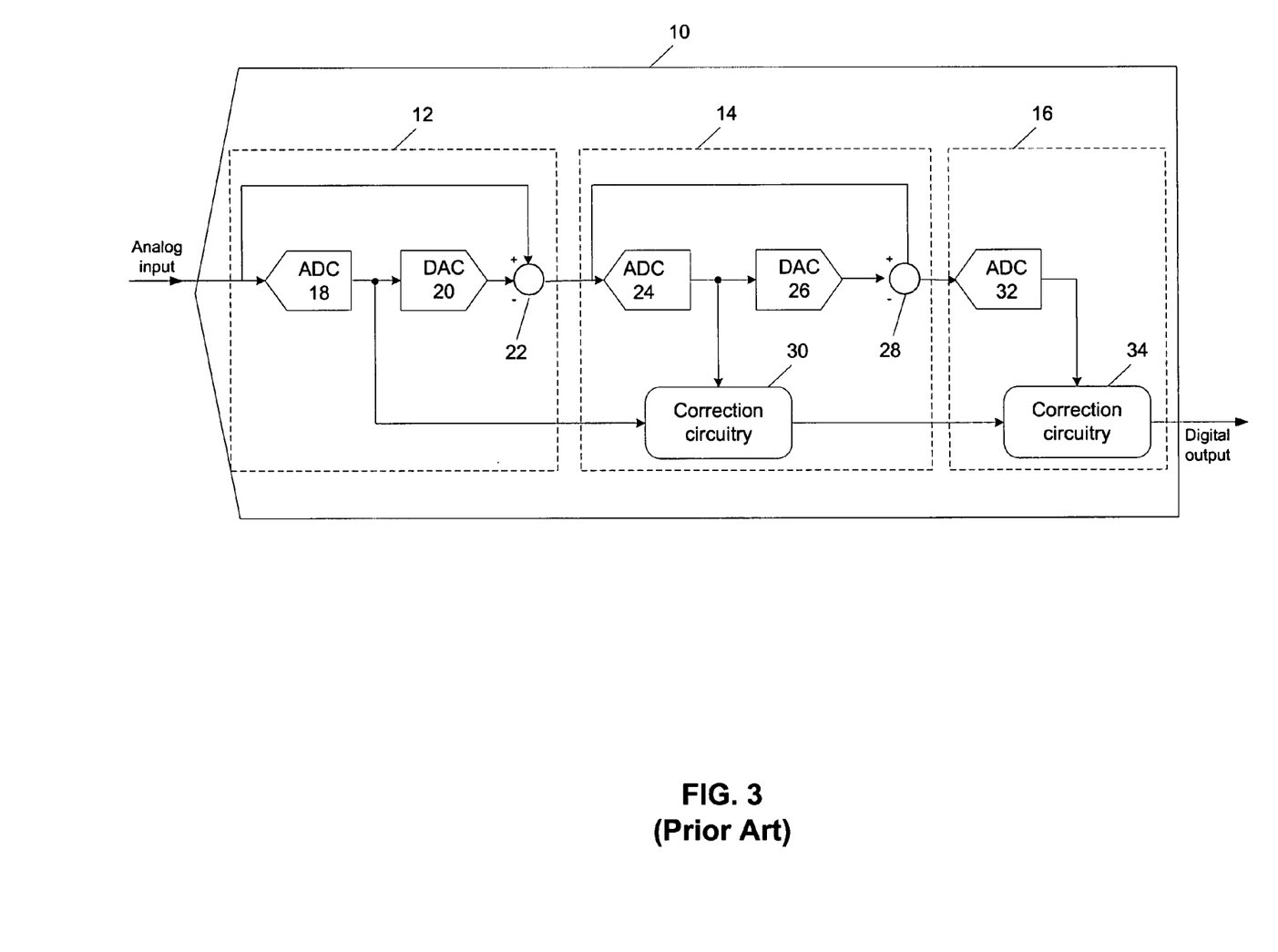
FIG. 3 shows a block diagram of a pipelined ADC.

A pipelined analog-to-digital converter (ADC) architecture improves the resolution with which an ADC can represent an analog signal as a digital value with less complexity than a flash converter which requires $2^N-1$ comparators for an N-bit converter. FIG. 3 shows a block diagram of a conventional pipelined ADC 10 that includes a first stage 12, a second stage 14, and a third stage 16. For purposes of illustration, only three internal stages are shown; however, the pipelined ADC 10 could include more than or less than three stages. The first stage 12 includes an internal ADC 18, an internal digital-to-analog converter 20 (DAC), and a subtractor 22. The second stage 14 includes an internal ADC 24, an internal DAC 26, a subtractor 28 and correction circuitry 30. The third stage 16 includes an internal ADC 32 and a correction circuitry 34. The full-scale ranges of the internal ADCs 18, 24, and 32 differ such that the internal ADC 18 has a larger full-scale range than the internal ADC 24; and the internal ADC 24 has a larger full-scale range than the internal ADC 32. The number of bits in the codes produced by each of the internal ADCs 18, 24, and 32 could be different from each other as well.

An analog signal received at the input of pipelined ADC 10 is routed to both the internal ADC 18 and the subtractor 22. The internal ADC 18 converts the analog signal to a digital signal (e.g., a binary code). The code produced at the output of the internal ADC 18 corresponds to the first-most significant bits of the overall output that is eventually produced by the pipelined ADC 10. The internal DAC 20 receives the code produced at the output of the internal ADC 18 and converts this signal to an analog signal. The subtractor 22 subtracts the analog signal produced by the internal DAC 20 from the analog signal received at the input of the internal ADC 18 to yield a first remainder value. The first remainder value has an amplitude that is much smaller than the amplitude of the original analog input value. For example, the amplitude of the original analog input value could be on the order of a volt and the amplitude of the first remainder value could be on the order of a millivolt. The subtractor 22 then passes the first remainder value to the second stage 14.

Theoretically, because the internal ADC 18 and DAC 20 have only a finite resolution, the output of the internal DAC 20 differs from the input received at the internal ADC 18 by an amount that is less than or equal to the resolution of the internal ADC 18. In reality, however, the internal ADC 18, the internal DAC 20, and the subtractor 22 have integral non linearity (INL) and thus their outputs will exhibit non-linear errors. For example, the digital output of stage 12 could be off by the INL of the internal ADC 18 and an additional quantization error which could be as much as 1 LSB, and the analog output of the internal DAC 20 could be off by the INL of the internal DAC 20 itself. As a result, the first remainder value could be as large as the sum of INL contributed from both the internal ADC 18 and from the internal DAC 20 and additionally the quantization error of the internal ADC 18. Thus, the first remainder value could be on the order of more than 1 LSB (e.g., 4 LSB) and could vary depending on the analog input.

The full range of the internal ADC 24 of the second stage 14 is selected to be larger than the biggest possible first remainder of the first stage 12. This ensures that the internal ADC 24 has adequate range to accurately convert the first remainder value to a digital code. For example, if the range of the internal ADC 24 were smaller than the first remainder value, the missing codes could occur in the overall digital output of the pipelined ADC 10, especially if the sum of INL of both the internal ADC 18 and the internal DAC 20 of the first stage 14 causes particular digital code transitions to be very close. As another consequence, the code produced by the pipelined ADC 10 may not be monotonic.

The first remainder value is received at the internal ADC 24 having a full-scale range that is much smaller than that of the internal ADC 18 but larger that the largest possible first remainder value and sufficient to resolve the first remainder value. This smaller full-scale range is usually achieved by amplification or as part of the internal ADC 24. The output code produced by the internal ADC 24 corresponds to the next-most significant bits of the pipelined ADC output. The correction circuitry 30 combines the first-most significant bits that were produced by ADC 18 with the next-most significant bits produced by ADC 24.

Because the full-scale range of the internal ADC 24 is greater than an LSB of the internal ADC 18, the codes produced by the internal ADCs 18 and 24 overlap. Thus a simple bits assembly method such as concatenation is insufficient for combining the internal codes. The correction circuitry 30 determines how to combine the internal codes taking into account the overlap between the codes. The region of overlap between codes depends on the accuracy of the internal ADC 24 and the internal DAC 26. In some embodiments, the region of overlap is on the order of the biggest sum of INL contributed from the internal ADC 18, the internal DAC 20, and the subtractor 22. A single output code produced by the correction circuitry 30 can result from more than one combination of outputs produced by the internal ADCs 18 and 24. Therefore, the mapping between an output of the correction circuitry 30 and the combination of outputs from the internal ADCs 18 and 24 is one-to-many and thus not unique.

The DAC 26 receives the code produced by the ADC 24 and converts this code to an analog signal. The subtractor 28 subtracts the analog signal produced by the internal DAC 26 from the analog signal received at the input of the internal ADC 24 (i.e., the first remainder value) to yield a second remainder value. The second remainder value is the portion of the first remainder value that cannot be resolved by the internal ADC 24. The subtractor 28 then passes the second remainder value to the ADC 32 of the third stage 16. The ADC 32 has a full-scale range that covers at least the largest possible second remainder value, which may cover multiple LSBs (e.g., 4 LSBs). The ADC 32 converts the second remainder value to a digital value that corresponds to the least significant bits of the overall output produced by the pipelined ADC 10. The correction circuitry 34 combines the output of the internal ADC 32 with the output of the correction circuitry 30 to produce the overall output of the pipelined ADC 10. In general, the mapping between the code produced by the correction circuitry 34 and the combination of outputs from the internal ADC 24 and the correction circuitry 30 is one-to-many and thus not unique. In general, the overall output of the pipelined ADC 10 corresponds to multiple internal codes. The multiple-to-one relationship between the overall output and the internal codes may limit the capability and performance of any linearity correction attempt from outside of the pipelined ADC 10.

Non-linearity of the pipelined ADC 10 adversely affects the accuracy of the overall output produced by the pipelined ADC 10. The non-linear error that is present in the overall output results from a combination of non-linear errors in the codes produced by the ADCs 18, 24, and 32. The error in the overall output of the pipelined ADC 10 could be greater than the error at any single internal stage. Conventional techniques that attempt to reduce non-linear errors in the output of the pipelined ADC 10 include global non-linearity compensation techniques.

Figure 4:
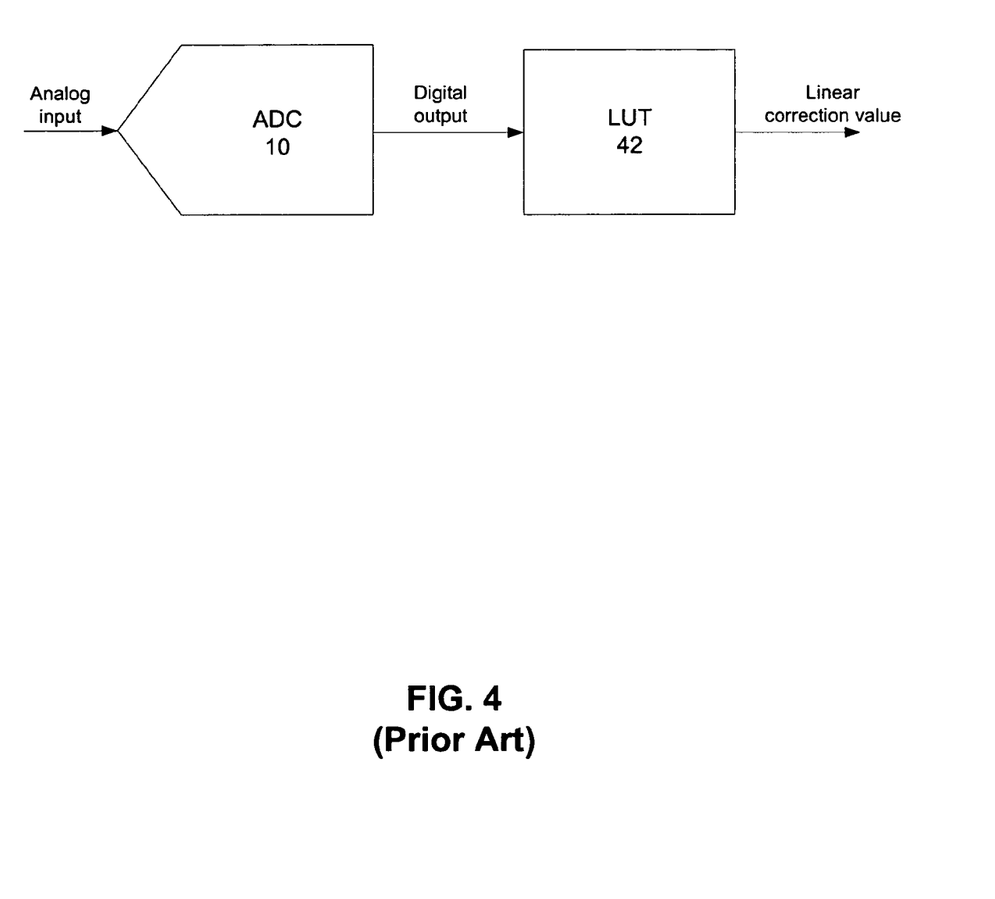
FIG. 4 shows a block diagram of a technique for globally compensating for non-linearity of the pipelined ADC of FIG. 4.

FIG. 4 illustrates a block diagram of a conventional global non-linearity compensating technique 40 in which a linearization lookup table 42 is connected to the output of the pipelined ADC 10. The linearization LUT 42 stores a corresponding known input analog voltage value that was previously measured and calculated for each of the output codes produced by the pipelined ADC 10. In other words, the linearization LUT 42 is a mapping between the output codes of the ADC 10 and the actual analog input voltage values that those codes represent. The analog input voltage values stored in the linearization LUT 42 are referred to as linear correction values. When the linearization LUT 42 receives a code generated by the pipelined ADC 10, it determines the memory address at which the linear correction value for the received code is stored and expresses that value at its output. In some embodiments, the linearization LUT 42 stores the difference that was measured between the digital value produced by the ADC 10 and the actual input analog value that corresponds to each code. In these embodiments, the linearization LUT 42 includes a summer that adds the difference to the code produced by the ADC 10 to generate a linear correction value.

Figure 5:
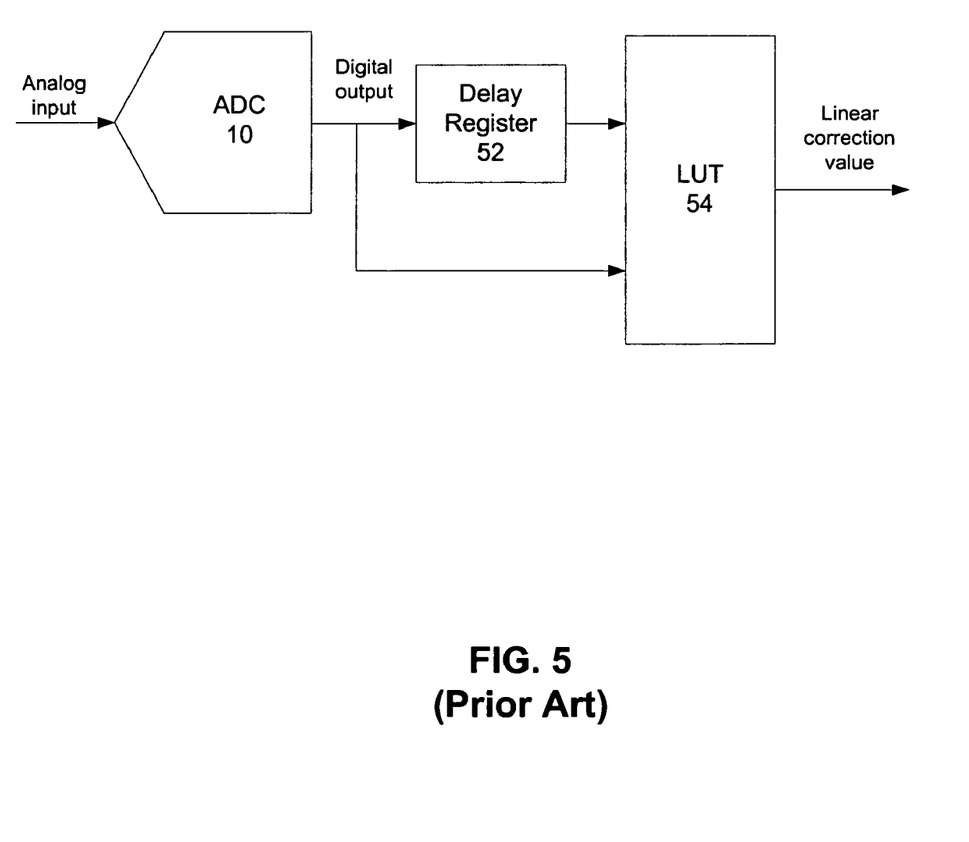
FIG. 5 shows a block diagram of another technique for globally compensating for non-linearity of the pipelined ADC of FIG. 4.

In some cases, the non-linear deviation of each code produced by ADC 10 may depend on previous state of all related circuits and especially on whether the input to the ADC 10 is increasing or decreasing. This dependence is referred to as a "memory effect." FIG. 5 illustrates a block diagram of a global non-linearity compensating technique 50 that accounts for the memory effect of ADC 10. The non-linearity compensating technique 50 is also sometimes referred to as "phase-plane" compensation. The technique 50 includes connecting the output of the ADC 10 to both a delay register 52 and a two-dimensional linearization LUT 54. The linearization LUT 54 includes a two-dimensional array of memory addresses. For each output code, the first dimension of the memory array stores a first linear correction value that corresponds to the code when the ADC 10 transitions to the code from a higher code. Similarly, for each output code, the second dimension of the memory array stores a second linear correction value that corresponds to the code when the ADC 10 transitions to the code from a lower code. In some embodiments, compression techniques are used to reduce the size of the LUT.

The delay register 52 holds a first output code received from the ADC 10 for one clock cycle. At next clock cycle, the linearization LUT 54 receives the first code from the delay register 52 and a second output code that the ADC 10 produces after it produces the first code. The linearization LUT 54 compares the second code to the first code to determine whether the input signal to the ADC 10 is increasing or decreasing. Based on this determination, the linearization LUT 54 retrieves and expresses the appropriate linear correction value stored for the received code. In some embodiments, the LUT 54 is a 2-dimensional table indexed by both the current code and the previous one. In some embodiments, the delay register 52 is integrated into the linearization LUT 54.

The efficacy of the global compensation techniques 40 and 50 are limited, especially when each output of internal ADC could not be uniquely determined from output of ADC 10. For every output of the ADC 10, the global compensation techniques 40 and 50 correct, only in sense of statistic, for non-linearity errors accumulated from the internal ADCs 18, 24, and 32. For instance, if 4 combinations of internal codes produce a unique output code, then the correction will be the average of all 4 combinations.

Furthermore, although technique 50 can determine whether the overall output signal is increasing or decreasing, the technique 50 is unable to determine whether the individual contributions to the overall output that are produced by the internal ADCs 18, 24, and 32 are increasing or decreasing. For example, the overall output value of ADC 10 may be higher than the previously asserted overall output value, but the output contributed by ADC 32 may be smaller than its previous output value if the least significant bits of the overall output decrease while the most significant bits increase.

Figure 6:
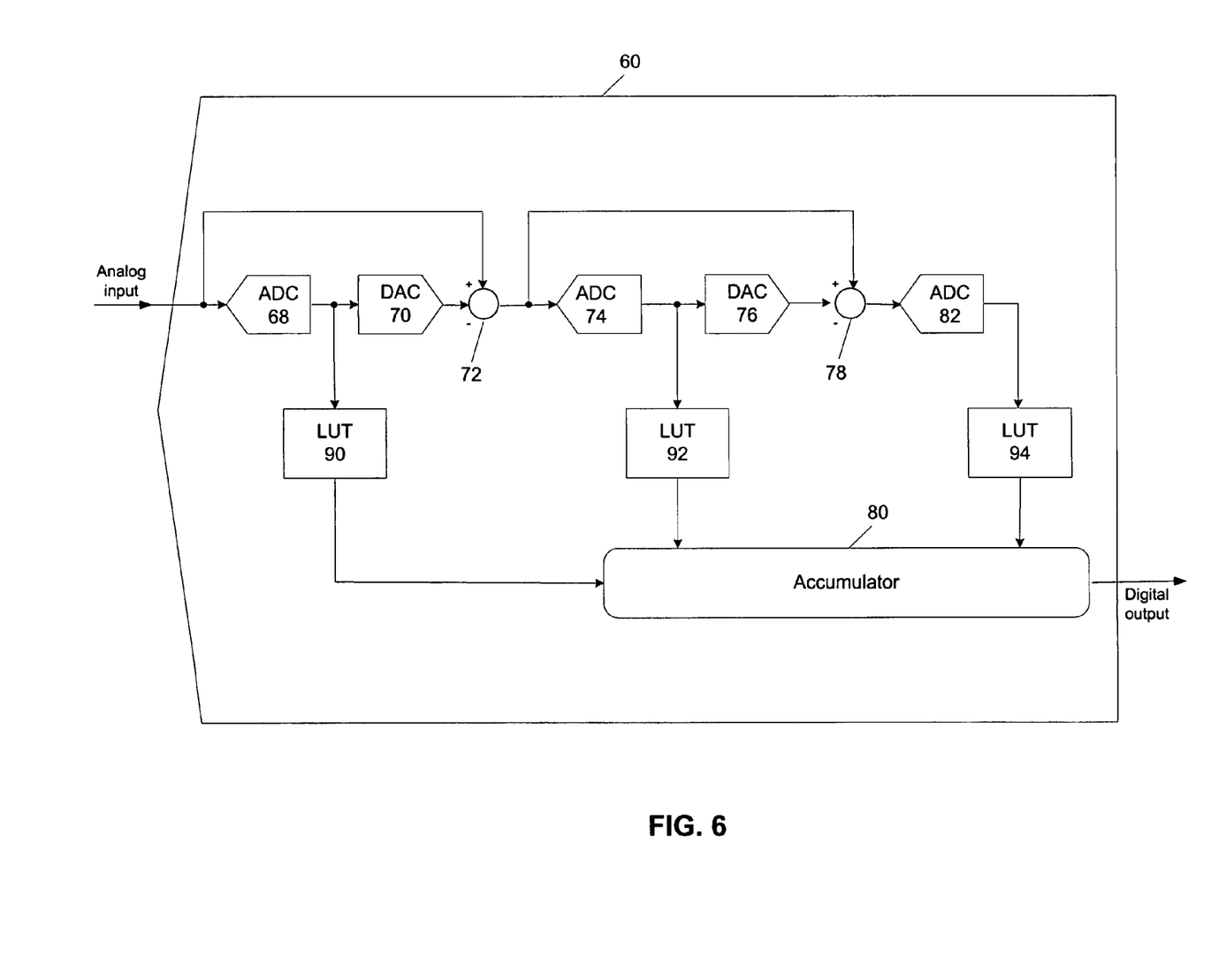
FIG. 6 shows a block diagram of a pipelined ADC with non-linearity compensation applied to its internal stages.

FIG. 6 shows a block diagram of a pipelined ADC 60 that compensates for non-linearity in each of its internal DAC's 70, 76, and ADC 82. In some embodiments, the pipelined ADC 60 also compensates for INL in the subtractors 72 and 78 as well. In addition to the internal ADCs 68, 74, and 82, and the subtractors 72 and 78, internal DACs 70 and 76, the pipelined ADC 60 includes an accumulator 80, and linearization LUTs 90, 92, and 94 that are connected to the outputs of ADCs 68, 74, and 82, respectively.

Linearization LUTs 90 and 92 are functionally similar to each other and store linearity correction values that were previously measured and calculated for the analog outputs produced by the respective internal DACs 70 and 76 given various digital input values. In some embodiments, linearization LUTs 90 and 92 store linearity correction values that compensate for combined linearity errors introduced by the DAC 70 and the subtractor 72 or DAC 76 and subtractor 78, respectively. Linearization LUT 94 is functionally similar to linearization LUT 42 and stores linearity correction values that were previously measured for ADC 82. For purposes of illustration, only three internal ADCs are shown; however, the pipelined ADC 60 could include more than or less than three stages.

An analog signal received at the input of pipelined ADC 60 is routed to both the internal ADC 68 and the subtractor 72. The internal ADC 68 converts the analog signal to a digital code. This output is sent to both the linearization LUT 90 and to the internal DAC 70. The internal DAC 70 converts the code produced by the ADC 68 to an analog signal and the subtractor 72 subtracts this analog signal from the analog signal received at the input of ADC 68 to yield a first remainder value. At the location indicated by the code it received, the LUT 90 contains the expected digital output value of the pipe-lined output value produced by the DAC 70 in response to receiving a code produced by the ADC 68. When the linearization LUT 90 receives a code generated by the ADC 68, it determines the memory address at which the correction value for the received code is stored and expresses that value at its output. The code produced by the linearization LUT 90 is equal in value to the analog output of the DAC 70 and has a resolution at least equal to that of ADC 60. In some embodiments, the LUT 90 also compensates for non-linear errors introduced into the first remainder by the subtractor 72. As explained above, the first remainder value could be as large as the sum of INL of the ADC 68, the DAC 70, and the subtractor 72 in addition to the quantization error of the ADC 68. The ADC 74, having a full-scale range that covers at least the largest possible first remainder value generated by the subtractor 72, which may cover multiple LSBs (e.g., 4 LSBs), converts the first remainder value to a digital code. This code is send to both the linearization LUT 92 and to the internal DAC 76. The internal DAC 76 converts the code produced by the ADC 74 to an analog signal and the subtractor 78 subtracts this analog signal from the analog signal received at the input of ADC 74 to yield a second remainder value. After receiving the code generated by the internal ADC 74, the linearization LUT 92 determines the memory address at which the correction value for the received code is stored and expresses that value at its output. The code produced by the linearization LUT 92 corresponds to the next-most significant range of the overall output produced by the pipelined ADC 60. The code produced by the linearization LUT 92 is equal in value to the analog output of the DAC 76 and has a resolution at least equal to that of ADC 74. In some embodiments, the LUT 92 also compensates for non-linear errors introduced into the second remainder by the subtractor 78.

The internal ADC 82, having a full-scale range that covers at least the largest second remainder, which may cover multiple LSBs (e.g., 4 LSBs), converts the second remainder value to a digital code. After receiving the code generated by the internal ADC 82, the linearization LUT 94 determines the memory address at which the correction value for the received code is stored and expresses that value at its output. The code produced by the linearization LUT 94 corresponds to the least significant range of the overall output of the pipelined ADC 60.

Theoretically, the sum of the digital value produced by the linearization LUT 90, which is equal to the analog value produced by the internal DAC 70, and the first remainder value produced by subtractor 72 equals the analog input value. Similarly, the sum of the output value produced by the linearization LUT 92, which is equal to the analog value produced by the internal DAC 76, and the second remainder value produced by the subtractor 78 equals the first remainder value. Thus, the sum of the outputs of the linearization LUTs 90 and 92, and the second remainder value equal the analog input value. The output of the linearization LUT 94 of the last stage equals the second remainder value given the output of the internal ADC 82. Thus, the sum of the outputs of the linearization LUTs 90, 92, and 94 equal the analog input value. Since it is desirable to produce a digital output that equals the analog input signal, the final digital output of the pipelined ADC 60 is simply the sum of the outputs of the LUTs 90, 92, and 94 from all stages. As each of the individual LUTs 90, 92, and 94 contains the digital output of their respective stage, their fractional resolution reduces rounding error of addition.

The accumulator 80 combines the linearized code produced by the linearization LUT 92 with the linearized code produced by the LUT 90 and LUT 94 to produce the overall output of the pipelined ADC 60.

In some embodiments, the linearity correction values stored in the LUTs 90 and 92 represent the difference between the actual DAC output value and the expected or ideal value that corresponds to the ADC output code that serves as an input to the DAC. Additionally in these embodiments, the linearity correction values stored in LUT 94 represent the different between the actual ADC output code and the expected or ideal value that corresponds to the ADC output code. In these embodiments, the LUTs 90, 92, and 94 include summers that add the difference values produced by the respective LUTs 90, 92, and 94 to the output codes produced by the respective internal ADCs 68, 74, and 82. Storing the difference values in the LUTs 90, 92, and 94 rather than the absolute outputs conserves memory because fewer bits are required to represent the difference values. In some embodiments, the linear correction values expressed by the LUTs 90, 92, and 94 contain more bits than the ADC 60. The LUT 94 is optional and may be omitted from the pipelined ADC 60, especially if the value produced by ADC 82 is sufficiently small. It may be useful to omit LUT 94 from the pipelined ADC 60, for example, to reduce production costs.

Figure 7:
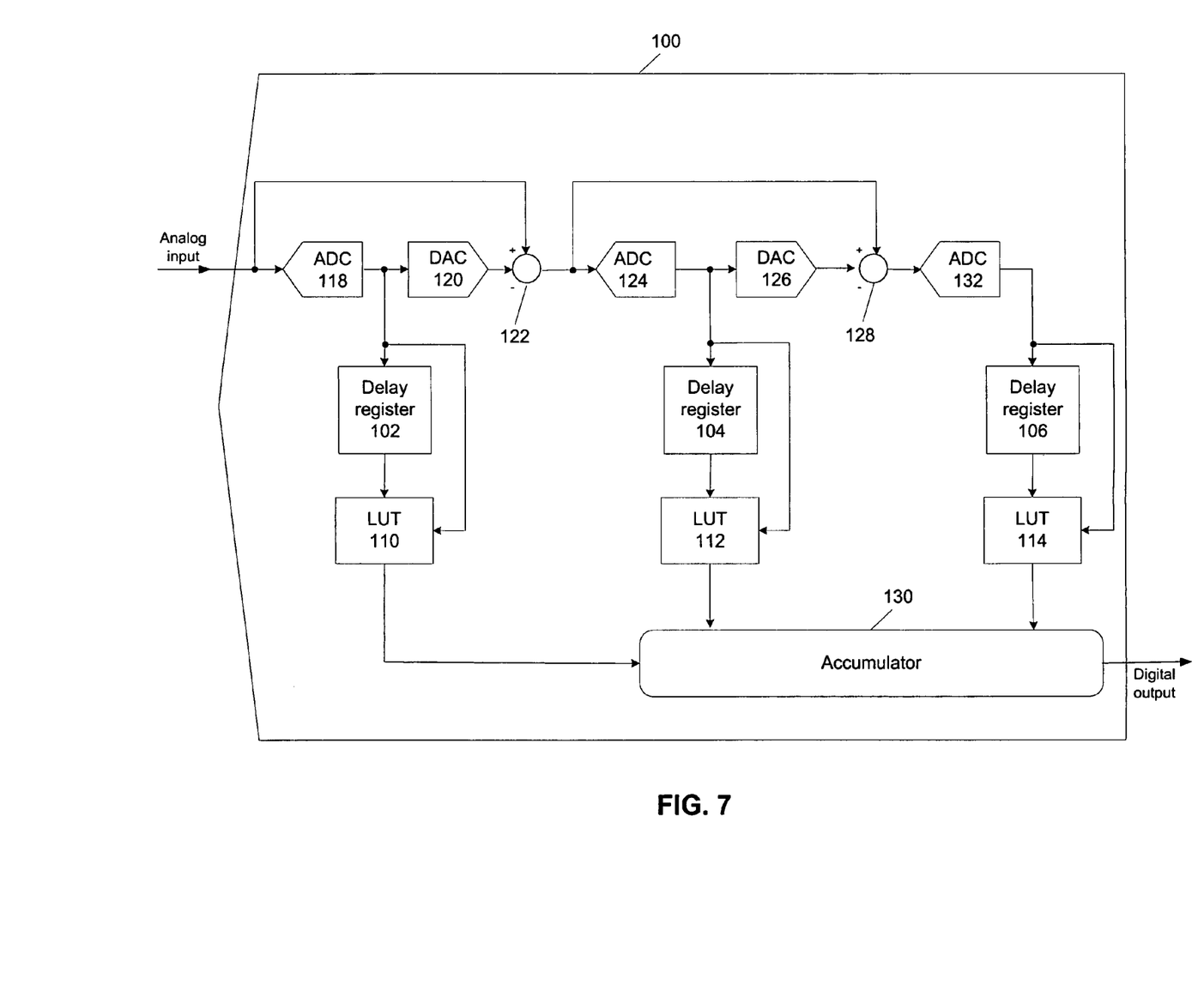
FIG. 7 shows a block diagram of another pipelined ADC with non-linearity compensation applied to its internal stages.

FIG. 7 shows a block diagram of a pipelined ADC 100 that compensates for non-linearity in each of its internal DAC 120, 126, and ADC 132. In addition to the internal ADCs 118, 124, and 132, internal DACs 120 and 126, and subtractors 122 and 128, the pipelined ADC 100 includes an accumulator 130, linearization LUTs 110, 112, and 114, and delay registers 102, 104, and 106. The delay registers 102, 104, and 106 are connected to the outputs of respective ADCs 118, 124, and 132 and to the inputs of LUTs 90, 92, and 94. The linearization LUTs 110, 112, and 114 together with the delay registers 102, 104, and 106 account for the memory affect of the respective ADCs 118, 124, and 132. For purposes of illustration, only three internal ADCs are shown; however, the pipelined ADC 100 could include more than or less than three stages.

The linearization LUTs 110, 112, and 114 are functionally similar to the linearization LUT 54 (FIG. 5). Linearization LUTs 110 and 112 store linearity correction values that were previously measured and calculated for the analog outputs produced by the respective internal DACs 120 and 126 given various digital input values. In some embodiments, linearization LUTs 110 and 112 store combined linearity correction values that compensate for linearity errors introduced by the DAC 120 and subtractor 122 or DAC 126 and subtractor 128, respectively. Linearization LUT 114 stores linearity correction values that were previously measured for ADC 132. For the respective internal ADCs 118, 124, and 132, the linearization LUTs 110, 112, and 114 each store a first set of linear correction values that correspond to the output codes when the input increases and a second set of linear correction values that correspond to the output codes when the input decreases. In some embodiments, only one linearization error value is stored for a code if the corresponding first and second linear correction values are substantially the same. In some other embodiments, LUT 110 and LUT 112 are 2-dimensioanl tables indexed by both the current code and the previous one. LUT compression techniques could still be used, meanwhile, as the number of bits of ADC 118 and 124 is significantly smaller than the overall ADC, the size of LUT are still small even for 2-dimensional tables.

An analog signal received at the input of pipelined ADC 100 is routed to both the internal ADC 118 and the subtractor 122. The internal ADC 118 converts the analog signal to a digital code that corresponds to the first most significant range of the overall output produced by the pipelined ADC 100. This output is sent to the delay register 102, to the linearization LUT 110, and to the internal DAC 120.

The delay register 102 holds the output code received from the internal ADC 118 for one clock cycle. At next clock cycle, the linearization LUT 110 receives the code held in the delay register 102 and a new code generated by the internal ADC 118. The linearization LUT 110 compares the codes received from the delay register 102 and the code received from the internal ADC 118 to determine whether the input signal to the internal ADC 118 is increasing or decreasing. Based on this determination, the linearization LUT 110 retrieves and expresses the appropriate linear correction value stored for the received code. In some other embodiments, the LUT 110 is simply a 2-dimensional table indexed by both the current code and the previous one. The code produced by the linearization LUT 110 is equal in value to the analog output of the DAC 120 and has at least a number of bits equal to that of ADC 118. In some embodiments, the LUT 110 compensates for combined non-linear errors introduced into the first remainder by DAC 120 and also by the subtractor 122. The code produced by the linearization LUT 110 corresponds to the first most significant range of the overall output produced by the pipelined ADC 100.

The internal DAC 120 converts the code produced by the ADC 118 to an analog signal and the subtractor 122 subtracts this analog signal from the analog signal received at the input of ADC 118 to yield a first remainder value. As explained above, the first remainder value could be as large as the sum of INL of the ADC 118, the DAC 120, and the subtractor 122 in addition to the quantization error of the ADC 118. is less than or equal to the largest code-transition step in the transfer function of the internal ADC 118, which may cover multiple LSBs (e.g., 4 LSBs).

The ADC 124, having a full-scale range that covers at least the largest code-transition step in the transfer function of the internal ADC 118 plus that of DAC 120, converts the remainder value to a digital code. This code is send to the delay register 104, to the linearization LUT 112 and to the internal DAC 126. The delay register 104 holds the output code received from the internal ADC 124 for one clock cycle. At next clock cycle, the linearization LUT 112 receives the code held in the delay register 104 and a new code generated by the internal ADC 124. The linearization LUT 112 compares the code received from the delay register 104 and the code received from the internal ADC 124 to determine whether the input signal to the internal ADC 124 is increasing or decreasing. Based on this determination, the linearization LUT 112 retrieves and expresses the appropriate linear correction value stored for the received code. In some other embodiments, the LUT 112 is simply a 2-dimensional table indexed by both the current code and the previous one. The code produced by the linearization LUT 112 is equal in value to the analog output of the DAC 126 and has a resolution better than that of the overall pipe-lined ADC 100. In some embodiments, the LUT 112 compensates for combined non-linear errors introduced into the second remainder by the DAC 126 and also by the subtractor 128. The code produced by the linearization LUT 112 corresponds to the next-most significant range of the overall output produced by the pipelined ADC 100. The internal DAC 126 converts the code produced by the internal ADC 124 to an analog signal. The subtractor 128 then subtracts this analog signal from the first remainder value received by ADC 124 to yield a second remainder value, which is the portion of the first remainder value that cannot be resolved by the current stage.

The internal ADC 132, having a full-scale range that covers at least the largest code-transition step in the transfer function of the internal ADC 124, which may cover multiple LSBs (e.g., 4 LSBs), converts the second remainder value to a digital code. The delay register 106 holds the output code received from the internal ADC 132 for one clock cycle. At next clock cycle, the linearization LUT 114 receives the code held in the delay register 106 and a new code generated by the internal ADC 132. The linearization LUT 114 compares the code received from the delay register 106 and the code received from the internal ADC 132 to determine whether the input signal to the internal ADC 132 is increasing or decreasing. Based on this determination, the linearization LUT 114 retrieves and expresses the appropriate linear correction value stored for the received code. In some embodiments, the LUT 114 is simply a 2-dimensional table indexed by both the current code and the previous one. The code produced by the linearization LUT 114 corresponds to the least significant range of the overall output of the pipelined ADC 100.

Theoretically, the sum of the digital value produced by the linearization LUT 110, which is equal to the analog value produced by the internal DAC 120, and the first remainder value produced by subtractor 122 equals the analog input value. Similarly, the sum of the output value produced by the linearization LUT 112, which is equal to the analog value produced by the internal DAC 126, and the second remainder value produced by the subtractor 128 equals the first remainder value. Thus, the sum of the outputs of the linearization LUTs 110 and 112, and the second remainder value equal the analog input value. The output of the linearization LUT 114 of the last stage equals the second remainder value given the output of the internal ADC 132. Thus, the sum of the outputs of the linearization LUTs 110, 112, and 114 equal the analog input value. Since it is desirable to produce a digital output that equals the analog input signal, the final digital output of the pipelined ADC 100 is simply the sum of the outputs of the LUTs 110, 112, and 114 from all stages. As each of the individual LUTs 110, 112, and 114 contains the digital output of their respective stage, their fractional resolution reduces rounding error of addition.

The accumulator 130 combines the linearized code produced by the linearization LUT 110 with the linearized code produced by the LUT 112 and to the linearized output of the LUT 114 to produce the overall output of the pipelined ADC 100.

In some embodiments, the linearity correction values stored in the LUTs 110, 112, and 114 represent the difference between the ADC output code and the actual input value that corresponds to the ADC output code that serves as an input to the DAC. Additionally in these embodiments, the linearity correction values stored in LUT 94 represent the different between the actual ADC output code and the expected or ideal value that corresponds to the ADC output code. In these embodiments, the LUTs 110 and 112 include summers that add the difference values produced by the respective LUTs 110, 112 to the input codes received by the respective internal DACs 120, 126; the LUT 114 includes a summer that add the difference values produced by the LUTs 114, to the output codes produced by the internal ADCs 132. Storing the difference values in the LUTs 110, 112, and 114 rather than the absolute outputs conserves memory because fewer bits are required to represent the difference values.

In some embodiments, the delay registers 102, 104, and 106 are integrated into the respective LUTs 110, 112, and 114. In further embodiments, the linear correction values expressed by the LUTs 110, 112, and 114 have a resolution better than the overall pipe-lined ADC 100. The LUT 114 is optional and may be omitted from the pipelined ADC 100, especially if the value produced by ADC 132 is sufficiently small. It may be useful to omit LUT 114 from the pipelined ADC 100, for example, to reduce production costs.

Figure 8:
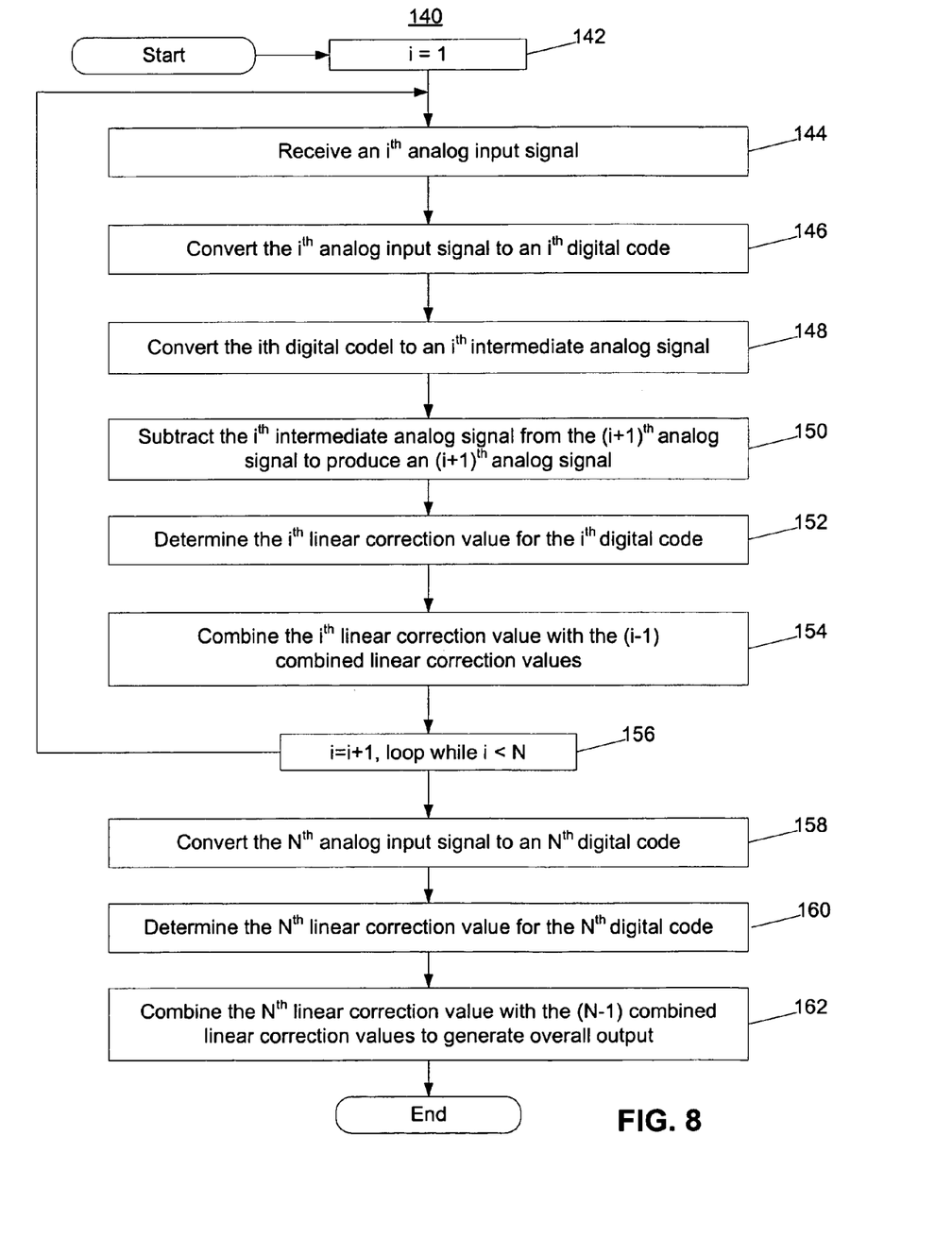
FIG. 8 shows a flowchart of a process for converting an analog signal to a digital code using either of the pipelined ADCs shown in FIGS. 6-7.

FIG. 8 shows a flowchart of a process 140 for converting an analog signal to digital code using either the pipelined ADC 60 shown in FIG. 6 or the pipelined ADC 100 shown in FIG. 7. The process 140 is performed by a pipelined ADC having a number of N total stages and thus a total of N internal ADCs. An index value is initially set (142) to one. A first analog input signal is received (146) by the pipelined ADC. In this case, the first analog signal is the analog input signal that the pipelined ADC converts to an output digital code. A first internal ADC (i.e., the internal ADC 68 of pipelined ADC 60 or the internal ADC 118 of pipelined ADC 100) converts (146) the first analog input signal to a first digital code. A first internal DAC (i.e., the internal DAC 70 of pipelined ADC 60 or the internal DAC 120 of pipelined ADC 100) converts (148) the first digital code to a first intermediate analog signal. The first intermediate analog signal is then subtracted (150) from the first analog signal to produce a second analog signal (i.e., the first remainder value). From the first digital code, a first linear correction value is determined (152) and expressed. In some embodiments in which the pipelined ADC 60 is performing the process 140, the linearization LUT 90 determines the first linear correction value from the first digital code. In some embodiments in which the pipelined ADC 100 is performing the process 140, the linearization LUT 110 first compares the first digital code to the previously produced code (held in delay register 102) the LUT 110 asserts an appropriate first linear correction value stored for the first digital code. Because there is no zero-eth linear correction value, the first linear correction value is combined (154) with a zero-valued code. The index value is incremented by one and a determination is made (146) as to whether or not the index value is less than N. If the index value is less than N, the receiving (144), digital conversion (146), analog conversion (148), subtraction (150), determining (152), and combining (154) steps are repeated. If the index value is greater than or equal to N, the $N^{th}$ analog signal is converted (158) to a digital code and from that code, the corresponding $N^{th}$ linear correction value is determined (160). The Nth linear correction value is combined (162) with a code resulting from combining the previous N-1 outputs from each of the N-1 internal ADCs to produce the overall output of the pipelined ADC.

Figure 9:
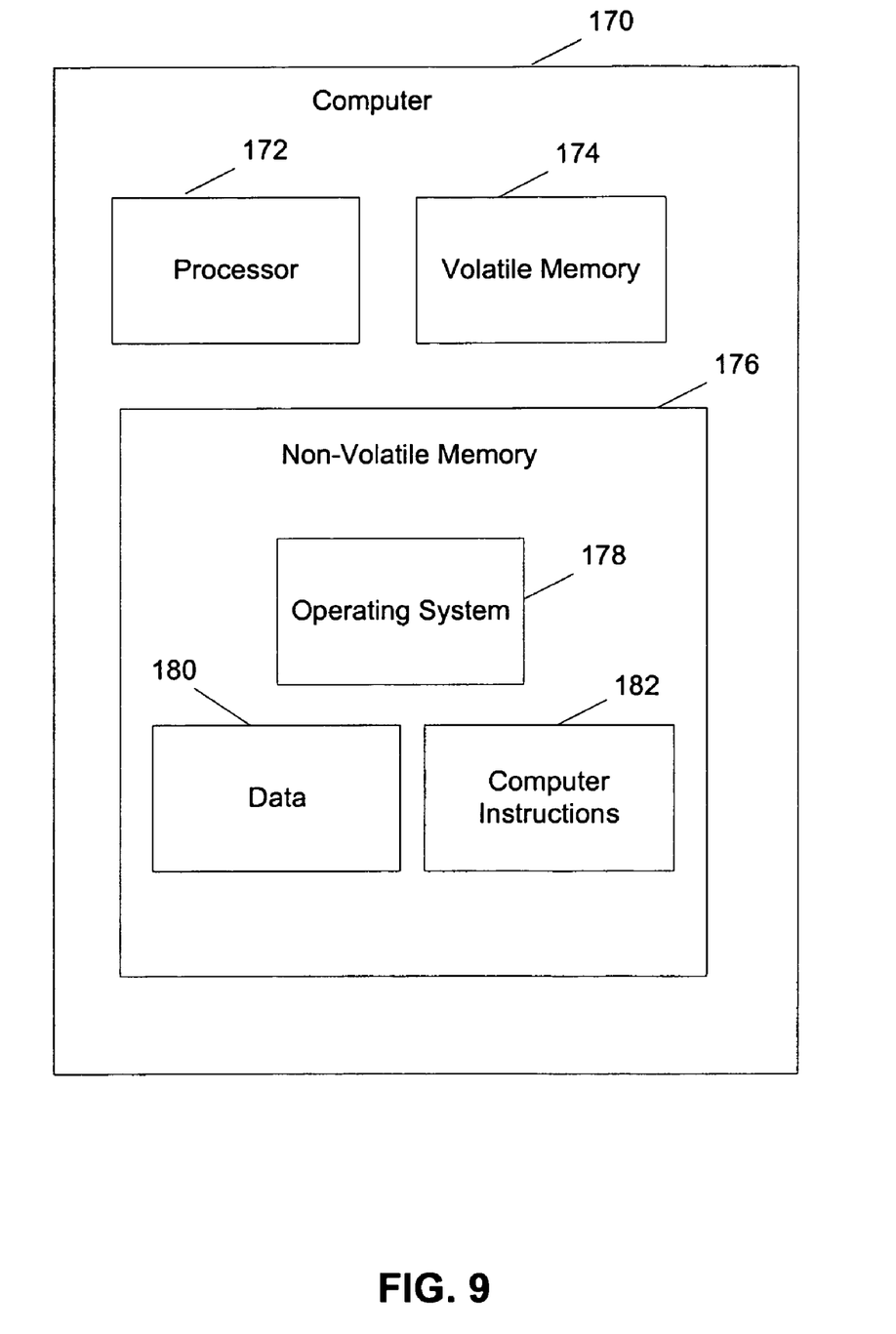
FIG. 9 shows a block diagram of a computer for implementing steps of the process shown in FIG. 8.

FIG. 9 shows a computer 170 for performing at least some steps of the analog-to-digital conversion process 140. Computer 170 includes a processor 172, a volatile memory 174, and a non-volatile memory 176 (e.g., hard disk). Non-volatile memory 176 stores operating system 178, data 180, and computer instructions 182 which are executed by processor 172 out of volatile memory 174 to perform process 100.

The process 140 is not limited to use with the hardware and software described herein. The process 140 can be implemented in digital electronic circuitry, or in computer hardware, firmware, software, or in combinations thereof.

The process 140 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the process 140 can be performed by one or more programmable processors executing one or more computer programs to perform the functions of the processes. All or part of the process 140 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including the internal ADCs, internal DACs, subtractors, linearization LUTs, delay registers, and correction circuitry may be implemented as part of the pipelined ADCs 60 and 100 or as separate circuitry for use in conjunction with the pipelined ADCs 60 and 100.

A number of embodiments of the invention have been described. Nevertheless, it will be understood that various modifications may be made without departing from the spirit and scope of the invention. For example, the pipelined ADCs 60 and 100 could have more or less internal stages than shown in FIG. 6 and FIG. 7. Accordingly, other embodiments are within the scope of the following claims.

What is claimed is:

1. An analog-to-digital converter (ADC) for converting an analog input value to an output digital code, the ADC comprising:
   a first ADC configured to receive the analog input value and to convert the analog input value to a first digital code;
   a first digital-to-analog converter (DAC) configured to convert the first digital code to a first analog value;
   a first linearization module configured to receive the first digital code and to produce a first linear-correction code;
   a second ADC configured to receive a remainder portion of the analog input value and to convert the remainder portion to a second digital code, wherein the remainder portion comprises a difference between the analog input value and the first analog value, and wherein the second ADC has a full-scale range that is greater than the remainder portion;
   a second linearization module configured to receive the second digital code and to produce a second linear-correction code; and
   an accumulator configured to combine the first linear-correction code and the second linear-correction code to produce the output digital code, wherein the remainder portion includes a quantization error contributed from the first ADC and non-linearity errors contributed from the first ADC, from the first DAC, and from a subtractor that computes the remainder portion, the first linear-correction code directly compensating for non-linearity errors contributed from the first DAC and the subtractor.

2. The system of claim 1, wherein the second linear-correction code is approximately equal to a previously measured analog input voltage value of the second ADC, the previously measured analog input voltage value corresponding to the second digital code.

3. The system of claim 1, wherein:
   the first linearization module comprises a first lookup table coupled to an output of the first ADC; and
   the second linearization module comprises a second lookup table coupled to an output of the second ADC.

4. The system of claim 3, wherein each of the first and second lookup tables is a two-dimensional lookup table indexed by a previous code and by a current code, wherein each lookup table is configured to produce a linear-correction code corresponding to the previous code and the current code.

5. The system of claim 1, wherein the first linearization module comprises a two-dimensional lookup table coupled to an output of the first ADC, wherein the two-dimensional lookup table stores a third linear-correction code that corresponds to the first digital code when the first ADC transitions to the first digital code from a higher code; and wherein the two-dimensional lookup table stores a fourth linear-correction code that corresponds to the first digital code when the first ADC transitions to the first digital code from a lower code; wherein the first linearization module is further configured to:
   compare the first digital code to a previous digital code produced by the first ADC;
   determine that the analog input value is increasing; and
   select the third linear-correction code to be the first linear-correction code.

6. The system of claim 1, wherein the second linearization module comprises a two-dimensional lookup table coupled to an output of the second ADC, wherein the two-dimensional lookup table stores a third linear-correction code that corresponds to the second digital code when the second ADC transitions to the second digital code from a higher code; and wherein the two-dimensional lookup table stores a fourth linear-correction code that corresponds to the second digital code when the second ADC transitions to the second digital code from a lower code; wherein the second linearization module is further configured to:
   compare the second digital code to a previous digital code produced by the second ADC;
   determine that the remainder portion is decreasing; and
   select the fourth linear-correction code to be the second linear-correction code.

7. The system of claim 1, wherein the full-scale range of the second ADC is greater than one least-significant bit of the first DAC.

8. The system of claim 1, wherein the first and second linear-correction codes comprise a most significant range and a least significant range, respectively, of the output digital code.

9. A method for converting an analog input value to an output digital code, the method comprising:
   at a first analog-to-digital converter (ADC), receiving the analog input value and converting the analog input value to a first digital code;
   at a first digital-to-analog converter (DAC), converting the first digital code to a first analog value;
   at a first linearization module, receiving the first digital code and producing a first linear-correction correction code;
   at a second ADC, receiving a remainder portion of the analog input value and converting the remainder portion to a second digital code, wherein the remainder portion comprises a difference between the analog input value and the first analog value;
   wherein a full-scale range of the second ADC is at least as large as the remainder portion, and wherein the remainder portion includes a quantization error contributed from the first ADC and non-linearity errors contributed from the first ADC, from the first DAC, and from a subtractor that computes the remainder portion, the first linear-correction code directly compensating for non-linearity errors contributed from the first DAC and from the subtractor;

at a second linearization module, receiving the second digital code and producing a second linear-correction code; and combining the first linear-correction code and the second linear-correction code to produce the output digital code.

10. The method of claim 9, wherein the second linear-correction code is approximately equal to a previously measured analog input voltage value of the second ADC, the previously measured analog input voltage value corresponding to the second digital code; and wherein the accumulator is configured to sum the first linear-correction code and the second linear-correction code to produce the output digital code.

11. The method of claim 9, further comprising:

storing, in a two-dimensional lookup table, a third linear-correction code that corresponds to the first digital code when the first ADC transitions to the first digital code from a higher code;

storing, in the two-dimensional lookup table, a fourth linear-correction code that corresponds to the first digital code when the first ADC transitions to the first digital code from a lower code.

comparing the first digital code to a previous digital code produced by the first ADC;

determining that the analog input value is increasing; and selecting the third linear-correction code to be the first linear-correction code.

12. The method of claim 9, further comprising:

storing, in a two-dimensional lookup table, a third linear-correction code that corresponds to the second digital code when the second ADC transitions to the second digital code from a higher code;

storing, in the two-dimensional lookup table, a fourth linear-correction code that corresponds to the second digital code when the second ADC transitions to the second digital code from a lower code;

comparing the second digital code to a previous digital code produced by the second ADC;

determining that the remainder portion is decreasing; and selecting the fourth linear-correction code to be the second linear-correction code.

13. The method of claim 9, further comprising:

indexing a two-dimensional lookup table by a previous code and by a current code; and storing, in the two-dimensional lookup table, a linear-correction code corresponding to the previous code and the current code.

14. The method of claim 9, wherein the full-scale range is greater than one least-significant bit of the first DAC.

15. The method of claim 9, further comprising selecting the first and second linear-correction codes to comprise a most significant range and a least significant range, respectively, of the output digital code.

16. The method of claim 9, wherein combining the first and second linear-correction codes comprises summing the first and second linear-correction codes.

17. An analog-to-digital converter (ADC) for converting an analog input value to an output digital code, the ADC comprising:

a first ADC configured to receive the analog input value and to convert the analog input value to a first digital code;

a digital-to-analog converter (DAC) coupled to the output of the first ADC and configured to convert the first digital code to a first analog value;

a first two-dimensional lookup table coupled to the output of the first ADC and configured to receive the first digital code and to store first and second linear-correction codes that are approximately equal to first and second analog output voltage values measured previously for the DAC in response to the first two-dimensional lookup table receiving the first digital code, wherein the first two-dimensional lookup table is configured to:

compare the first digital code to a previous code produced by the first ADC;

select the first linear-correction code if the first digital code is larger than the previous code; and select the second linear-correction code if the first digital code is less than the previous code;

a subtractor coupled to the output of the DAC and configured to subtract the first analog value from the analog input value to produce a remainder value;

a second ADC coupled to the output of the subtractor and configured to convert the remainder value to a second digital code;

a second two-dimensional lookup table coupled to the ouput of the second ADC and configured to receive the second digital code and to store third and fourth linear-correction codes that are approximately equal to third and fourth analog input voltage values measured previously for the second digital code, wherein the second two-dimensional lookup table is configured to:

compare the second digital code to a previous code produced by the second ADC;

select the third linear-correction code if the second digital code is larger than the previous code; and select the fourth linear-correction code if the second digital code is less than the previous code; and an accumulator configured to combine one of the first and second linear-correction codes and one of the third and fourth linear-correction codes to produce the output digital code.

18. An analog-to-digital converter (ADC) for converting an analog input value to an output digital code, the ADC comprising:

a first analog-to-digital converter configured to receive the analog input value and to convert the analog input value to a first digital code;

a first digital-to-analog converter (DAC) configured to convert the first digital code to a first analog value;

a first linearization module configured to receive the first digital code and to produce a first linear-correction code that is approximately equal to the first analog value, wherein the first linearization module stores linear-correction codes previously determined by measuring output values produced by the first DAC in response to receiving multiple digital input values, the linear-correction codes including the first linear-correction code;

a second ADC configured to receive a remainder portion of the analog input value and to convert the remainder portion to a second digital code, wherein the remainder portion comprises a difference between the analog input value and the first analog value;

a second linearization module configured to receive the second digital code and to produce a second linear-correction code; and an accumulator configured to combine the first linear-correction code and the second linear-correction code to produce the output digital code.

19. A method for converting an analog input value to a multi-stage analog-to-digital converter (ADC) to an output digital code, the method comprising:

at a first ADC internal to the multi-stage ADC, receiving the analog input value and converting the analog input value to a first digital code;

at a first digital-to-analog converter (DAC) internal to the multi-stage ADC, converting the first digital code to a first analog value;

at a first linearization module, receiving the first digital code and producing a first linear-correction code that is approximately equal to the first analog value, wherein the first linearization module stores linear-correction codes previously determined by measuring output values produced by the first DAC in response to receiving multiple digital input values, the linear-correction codes including the first linear-correction code;

at a second ADC internal to the multi-stage ADC, receiving a remainder portion of the analog input value and converting the remainder portion to a second digital code, wherein the remainder portion comprises a difference between the analog input value and the first analog value;

at a second linearization module, receiving the second digital code and producing a second linear-correction code; and combining the first linear-correction code and the second linear-correction code to produce the output digital code.

* * * * *

UNITED STATES PATENT AND TRADEMARK OFFICE
CERTIFICATE OF CORRECTION

PATENT NO. : 7,352,306 B2  Page 1 of 1
APPLICATION NO. : 11/291660
DATED : April 1, 2008
INVENTOR(S) : Fang Xu It is certified that error appears in the above-identified patent and that said Letters Patent is hereby corrected as shown below:

Column 13, Claim 1, Line 53 (Approx.):
In Claim 1, after "and"
insert -- from --.

Column 14, Claim 9, Line 52:
In Claim 9, after "correction"
delete "correction".
(Second Occurrence)

Column 16, Claim 17, Line 25:
In Claim 17, delete "output" and
insert -- output --, therefor.

Signed and Sealed this

First Day of July, 2008

JON W. DUDAS
*Director of the United States Patent and Trademark Office*